United States Patent
Jahangiri et al.

(10) Patent No.: US 6,939,792 B1
(45) Date of Patent: Sep. 6, 2005

(54) LOW-K DIELECTRIC LAYER WITH OVERLYING ADHESION LAYER

(75) Inventors: Maryam Jahangiri, Sunnyvale, CA (US); Mira Ben-Tzur, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 5 days.

(21) Appl. No.: 10/402,865

(22) Filed: Mar. 28, 2003

(51) Int. Cl.[7] ............ H01L 21/469; H01L 23/522
(52) U.S. Cl. ............ 438/624; 438/763; 438/790; 438/958; 257/760
(58) Field of Search .................. 257/759, 760; 438/623, 624, 763, 780, 782, 790, 791, 958

(56) References Cited

U.S. PATENT DOCUMENTS

| | | | | |
|---|---|---|---|---|
| 5,290,727 A | * | 3/1994 | Jain et al. ............ | 438/238 |
| 6,207,554 B1 | * | 3/2001 | Xu et al. ............ | 438/624 |
| 6,211,570 B1 | * | 4/2001 | Kakamu ............ | 257/760 |
| 6,660,661 B1 | * | 12/2003 | Ben-Tzur et al. ............ | 438/778 |
| 6,737,747 B2 | * | 5/2004 | Barth et al. ............ | 257/760 |
| 2002/0164889 A1 | * | 11/2002 | Tsai et al. ............ | 438/763 |
| 2003/0020163 A1 | * | 1/2003 | Hung et al. ............ | 257/734 |
| 2003/0062336 A1 | * | 4/2003 | Restaino et al. ............ | 216/57 |

OTHER PUBLICATIONS

SiLK Products (10 pages). The Dow Chemical Company, 1995-2002, webpage [online]; retrieved on Jan. 2, 2003; retrieved from the internet: <URL:http://www.dow.com/silk>.

* cited by examiner

*Primary Examiner*—Stephen W. Smoot
(74) *Attorney, Agent, or Firm*—Okamoto & Benedicto LLP

(57) ABSTRACT

In one embodiment, a method of fabricating an integrated circuit includes forming a low-k dielectric layer over metal lines, forming an adhesion layer over the low-k dielectric layer, and forming a capping layer over the adhesion layer. The low-k dielectric may comprise SiLK™ dielectric material, while the capping layer may comprise TEOS. The resulting stack of dielectric materials may be employed in a passivation level to protect the metal lines. For example, a topside layer may be formed over the capping layer.

20 Claims, 4 Drawing Sheets

LOW-K DIELECTRIC LAYER WITH OVERLYING ADHESION LAYER

REFERENCE TO RELATED APPLICATIONS

This application is related to the following commonly-assigned disclosures, which are incorporated herein by reference in their entirety:

(a) U.S. application Ser. No. 10/183,095, entitled "INTEGRATED CIRCUIT WITH IMPROVED RC DELAY," filed on Jun. 26, 2002, by Mira Ben-Tzur, Krishnaswamy Ramkumar, Alain Blosse, and Fuad Badrieh; and (b) U.S. application Ser. No. 10/184,336, entitled "PROTECTION OF A LOW-K DIELECTRIC IN A PASSIVATION LEVEL," filed on Jun. 26, 2002 by Mira Ben-Tzur, Krishnaswamy Ramkumar, Saurabh Dutta Chowdhury, and Michal Efrati Fastow.

BACKGROUND OF THE INVENTION

1. Field of the Invention

The present invention relates generally to integrated circuits, and more particularly to integrated circuit fabrication processes and structures.

2. Description of the Background Art

A typical integrated circuit has several vertically stacked levels, with any given level comprising one or more layers of materials. The topmost level in an integrated circuit is referred to as a "passivation level." The passivation level helps protect an integrated circuit's structures during packaging and in operation. Below the passivation level are metal and dielectric levels. Metal levels include metal lines for carrying electrical signals. Dielectric levels provide electrical isolation between metal levels.

The speed at which a signal is propagated in an integrated circuit is limited by the delay through the metal line carrying the signal. This delay, commonly known as "RC delay," is determined by the product of the resistance (R) and capacitance (C) of the metal line. Reducing the resistance and/or capacitance of a metal line lowers its RC delay and increases signal propagation speed. Thus, reducing the RC delay of metal lines plays a major role in making integrated circuits run faster.

SUMMARY

In one embodiment, a method of fabricating an integrated circuit includes forming a low-k dielectric layer over metal lines, forming an adhesion layer over the low-k dielectric layer, and forming a capping layer over the adhesion layer. The low-k dielectric may comprise SiLK™ dielectric material, while the capping layer may comprise TEOS. The resulting stack of dielectric materials may be employed in a passivation level to protect the metal lines. For example, a topside layer may be formed over the capping layer.

These and other features of the present invention will be readily apparent to persons of ordinary skill in the art upon reading the entirety of this disclosure, which includes the accompanying drawings and claims.

The use of the same reference label in different drawings indicates the same or like components. Drawings are not to scale unless otherwise noted.

DETAILED DESCRIPTION

In the present disclosure, numerous specific details are provided such as examples of materials, process steps, and structures to provide a thorough understanding of embodiments of the invention. Persons of ordinary skill in the art will recognize, however, that the invention can be practiced without one or more of the specific details. In other instances, well-known details are not shown or described to avoid obscuring aspects of the invention. For example, masking and patterning steps have been omitted in the interest of clarity.

Embodiments of the present invention are hereinafter discussed using the SILK™ dielectric as a low-k dielectric material. It should be understood, however, that embodiments of the present invention may be readily adapted to solve process integration problems involving other low-k dielectric materials. Note that as used in the present disclosure, the term "low-k dielectric" refers to a dielectric material having a dielectric constant less than about 3.9 (i.e., k<3.9).

Figure 1:
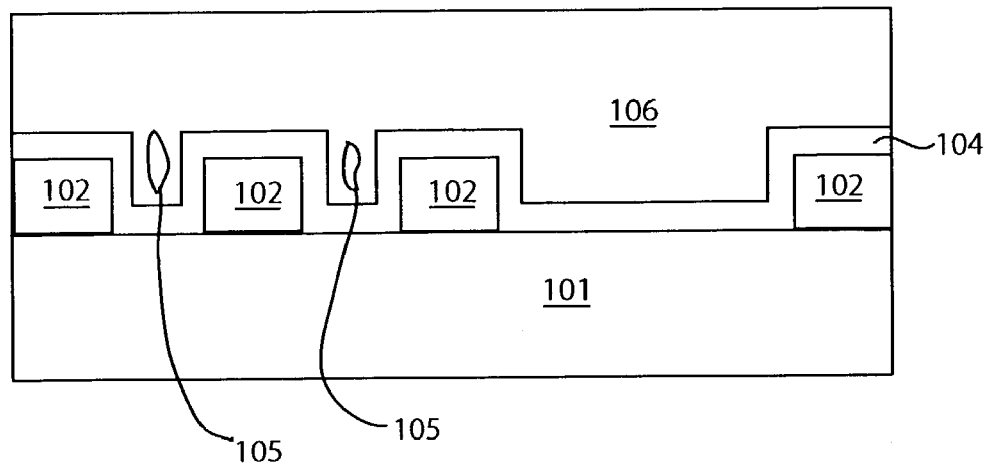
FIG. 1 schematically shows a cross-sectional view of a conventional integrated circuit that includes a passivation level.

Referring now to FIG. 1, there is shown a portion of a conventional integrated circuit with a passivation level comprising a capping layer 104 and a topside layer 106. The passivation level protects underlying structures, such as metal lines 102. Capping layer 104 may be a 1000 Angstroms thick silicon dioxide layer. A silicon dioxide layer may be deposited using TEOS (tetraethyl ortho-silicate) as a precursor. Topside layer 106 may comprise silicon nitride, which may be deposited using silane or dichlorosilane as a precursor. Both capping layer 104 and topside layer 106 may be deposited by plasma enhanced chemical vapor deposition (PECVD).

Metal lines 102 may be in a last metal level (i.e., the metal level closest to the passivation level) of an integrated circuit. Underneath metal lines 102, which may comprise aluminum, is a dielectric level that comprises a dielectric layer 101. Dielectric layer 101 may be a layer of silicon dioxide. In FIG. 1, various levels underneath dielectric layer 101 are not shown for clarity of illustration.

Because of the inability of topside layer 106 to fill small spaces, air gaps 105 may or may not form between metal lines 102. Air gaps 105 tend to form at relatively narrow metal line spacing because the aspect ratio in such cases is typically large. Air gaps 105 are voids and thus have a dielectric constant approximately equal to 1. The low dielectric constant of air gaps 105 helps lower capacitance on metal lines 102. However, the size and formation of air gaps 105 are not readily controllable because they vary with the critical dimensions of metal lines 102. Additionally, the dielectric constant of topside layer 106 is relatively high (e.g., the dielectric constant of silicon nitride is approximately 7.0), which offsets the low dielectric constant of air gaps 105.

As semiconductor manufacturers implement more highly integrated chip designs, propagation speeds of signals through metal lines becomes increasingly sensitive to capacitance effects between the metal lines. One technique for reducing capacitance on metal lines is to deposit a low-k dielectric layer over and between the metal lines as described in U.S. application Ser. No. 10/183,095, entitled "INTEGRATED CIRCUIT WITH IMPROVED RC DELAY," filed on Jun. 26, 2002, by Mira Ben-Tzur, Krishnaswamy Ramkumar, Alain Blosse, and Fuad Badrieh, incorporated herein by reference in its entirety.

Figure 2:
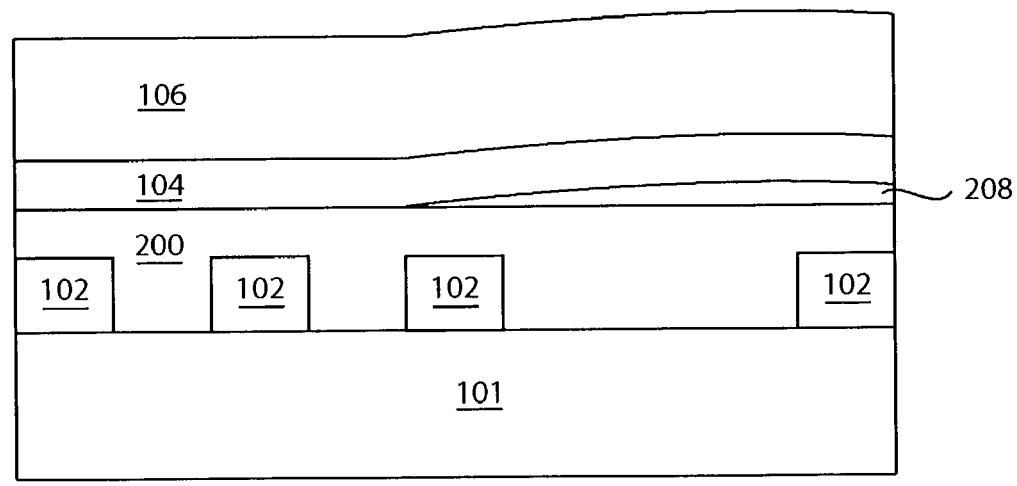
FIG. 2 schematically shows a cross-sectional view of an integrated circuit fabricated by the inventors in one experiment.

FIG. 2 schematically shows a cross-sectional view of an integrated circuit fabricated by the inventors in one experiment. The sample of FIG. 2 is similar to the sample of FIG. 1 except that the sample of FIG. 2 includes a low-k dielectric layer 200 over and between metal lines 102. In FIG. 2, low-k dielectric layer 200 comprising. SILK™ dielectric was formed over dielectric layer 101 and metal lines 202. SILK™ dielectric is commercially available from The Dow Chemical Company of Midland, Mich. (on the Internet: www.silk.dow.com). SILK™ dielectric has a dielectric constant of about 2.65 and a thermal stability up to about 450° C. Other information regarding SILK™ dielectric, including information on its use and application, may be obtained from its vendor, The Dow Chemical Company. Low-K dielectric layer 200 was formed using a spin-on deposition process.

In FIG. 2, capping layer 104 (hereinafter TEOS capping layer 104) comprises silicon dioxide deposited using TEOS as a precursor. TEOS capping layer 104 advantageously serves as a buffer for the underlying low-k dielectric 200, thereby minimizing process integration issues with low-k dielectric 200. However, the inventors discovered that a TEOS capping layer 104 would delaminate (i.e., peel off) from low-k dielectric layer 200 after a wet cleaning step. In FIG. 2, TEOS capping layer 104 delaminated (see gap 208) from low-k dielectric layer 200 comprising SILK™ dielectric after a wet clean step involving the EKC 265™ cleaning solvent at 65° C. (EKC 265™ is available from Dupont Electronic Technologies). The inventors discovered in another experiment that a capping layer of silane oxide is also susceptible to delamination when deposited on a layer of SILK™ dielectric.

The inventors also found that silicon nitride adheres relatively well to SILK™ dielectric. Thus, a possible approach to the aforementioned delamination problem is to employ a capping layer of silicon nitride instead of TEOS. However, the dielectric constant of silicon nitride is higher than that of TEOS, thus negating some of the advantages of using a low-k dielectric.

Figure 3A:
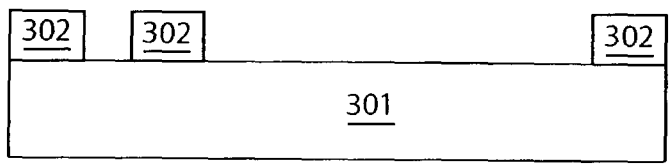
FIGS. 3(a)–3(e) show cross-sectional views schematically illustrating the fabrication of an integrated circuit in accordance with an embodiment of the present invention.

FIGS. 3(a)–3(e) show cross-sectional views schematically illustrating the fabrication of an integrated circuit in accordance with an embodiment of the present invention. In FIG. 3(a), metal lines 302 are formed over dielectric layer 301. Dielectric layer 301 may comprise silicon dioxide deposited to a thickness of about 3000 Angstroms to about 6000 Angstroms by PECVD. Depending on the application, there may be metal levels and other dielectric levels below dielectric layer 301.

It is to be noted that as used in the present disclosure, the terms "over", "overlying", "under", and "underlying" refer to the relative placement of two materials that may or may not be directly in contact with each other. That is, the two materials may be separated by another material. For example, another material may be formed between a metal line 302 and dielectric layer 301.

Still referring to FIG. 3(a), metal lines 302 may be in a metal level just below a subsequently formed passivation level. Metal lines 302 may be in a last metal level if the integrated circuit has several metal levels. Metal lines 302 may also be in a first metal level if the integrated circuit has only one metal level. Metal lines 302 may be formed by depositing an interconnect material on dielectric layer 301, and then patterning the interconnect material. The thickness of metal lines 302 depends on the application. Advantageously, metal lines 302 are formed to be as thick as the application will allow to lower their resistance and thereby reduce RC delay. In one embodiment, metal lines 302 are formed to a thickness of approximately 8600 Angstroms.

Figure 4:
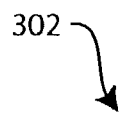
FIG. 4 shows a cross-sectional view schematically illustrating a metal stack in accordance with an embodiment of the present invention.

Referring to FIG. 4, a metal line 302 may be a metal stack that comprises a layer 401 (e.g., titanium, titanium-tungsten, titanium/titanium-tungsten, or titanium-nitride), a metal layer 402, and a layer 403 (e.g., titanium-tungsten, titanium/titanium-tungsten, or titanium-nitride). In one embodiment, layer 401 is a 300 Angstroms thick titanium layer formed on a dielectric level (not shown), while layer 403 is a 300 Angstroms thick titanium-tungsten layer formed on metal layer 402. Metal layer 402 is preferably deposited to be as thick as possible to minimize its resistance and the resulting RC delay. Metal layer 402 may be a layer of aluminum formed to a thickness of about 8000 Angstroms.

Figure 3B:
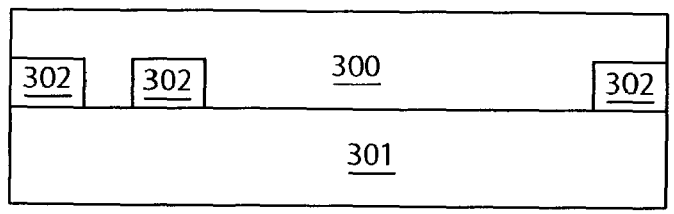

Continuing in FIG. 3(b), a passivation level is formed by first forming a low-k dielectric layer 300 over metal lines 302. Low-k dielectric layer 300 comprises a dielectric material having a dielectric constant of about 3.9 or less (i.e., k<3.9). Low-k dielectric layer 300 preferably has gap-fill capability to substantially fill spaces between metal lines 302. Although air gaps may not form between metal lines 302 because of the gap-fill capability, the relatively low dielectric constant of low-k dielectric layer 300 helps reduce capacitance and the resulting RC delay on metal lines 302. As can be appreciated, because low-k dielectric 300 does not depend on the formation of air gaps, the reduced capacitance may be achieved over a wide range of metal line spacing. Additionally, because there is no variability associated with air gap formation, the capacitance between metal lines (and the RC delay of the metal lines) will have a tighter distribution, and hence a more predictable value.

In one embodiment, low-k dielectric layer 300 comprises SILK™ dielectric deposited to a thickness of about 1 $\mu$m. The thickness of low-k dielectric 300 may vary depending on the application. A layer of SILK™ dielectric may be formed using a spin-on deposition process.

Figure 3C:
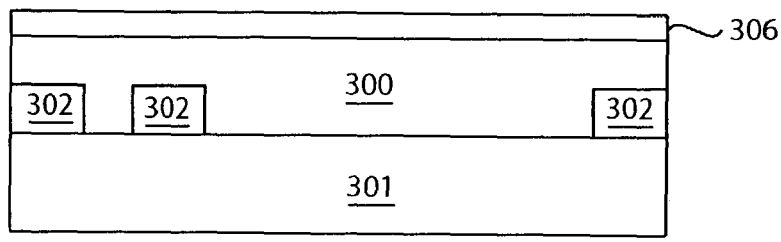

In FIG. 3(c), an adhesion layer 306 is deposited on low-k dielectric layer 300. Adhesion layer 306 advantageously allows a TEOS capping layer to be formed over a low-k dielectric layer 300 comprising SILK™ dielectric. In one embodiment, adhesion layer 306 comprises the AP6000™ adhesion promoter available from The Dow Chemical Company. The AP6000™ adhesion promoter is a low-k dielectric material having a dielectric constant of about 2.98. In one embodiment, an adhesion layer 306 comprising the AP6000™ adhesion promoter is formed to a thickness of about 70 Angstroms. The AP6000™ adhesion promoter may be deposited using a spin-on process. It is to be noted that the AP6000™ adhesion promoter is typically employed to allow a SILK™ dielectric layer to adhere to an underlying (not overlying) material, such as a metal, polymer, oxide, or substrate.

Figure 3D:
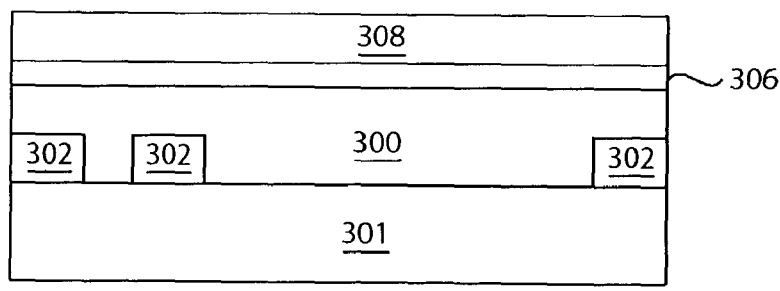

In FIG. 3(d), a capping layer 308 is formed over adhesion layer 306. In one embodiment, capping layer 308 is formed by depositing silicon dioxide on adhesion layer 306 using TEOS as a precursor. A TEOS capping layer 308 may be deposited to a thickness of about 1000 Angstroms by PECVD. A TEOS capping layer 308 advantageously buffers the underlying low-k dielectric layer 300 to minimize integration issues that may result if low-k dielectric layer 300 is exposed during subsequent processing steps. Although TEOS has a dielectric constant of about 4.0, and therefore is not a low-k dielectric for purposes of the present disclosure, TEOS has a lower dielectric constant than silicon nitride, for example.

Figure 3E:
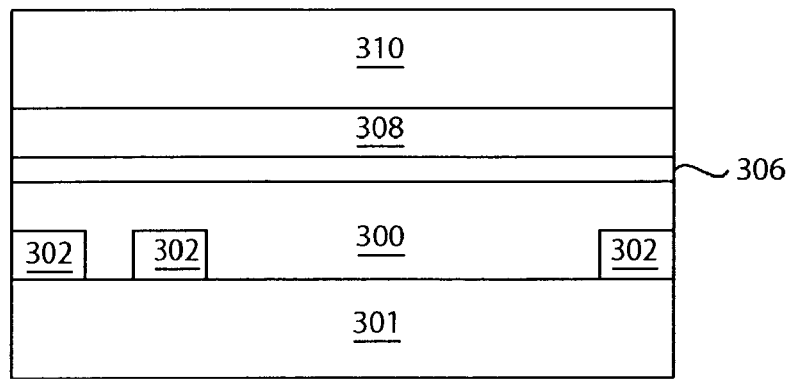

In FIG. 3(e), a topside layer 310 is formed over capping layer 308. Topside layer 310, capping layer 308, adhesion layer 306, and low-k dielectric 300 form a passivation level that helps protect metal lines 302 and other underlying structures. In one embodiment, topside layer 310 comprises silicon nitride deposited to a thickness of about 9000 Angstroms by PECVD.

Low-k dielectric layer 300 may absorb humidity when exposed to air or wet solvents. This may occur, for example, after etching the passivation level to expose metal pads. In that case, spacers may be formed on exposed portions of low-k dielectric layer 300. For example, silicon nitride spacers may be deposited along a sidewall (not shown) including exposed portions of low-k dielectric layer 300. Techniques for protecting a low-k dielectric in a passivation level are also described in the commonly-assigned disclosure U.S. application Ser. No. 10/184,336, entitled "PROTECTION OF A LOW-K DIELECTRIC IN A PASSIVATION LEVEL," filed on Jun. 26, 2002 by Mira Ben-Tzur, Krishnaswamy Ramkumar, Tito Chowdhury, and Michal Efrati Fastow. The just mentioned disclosure is incorporated herein by reference in its entirety.

Figure 5:
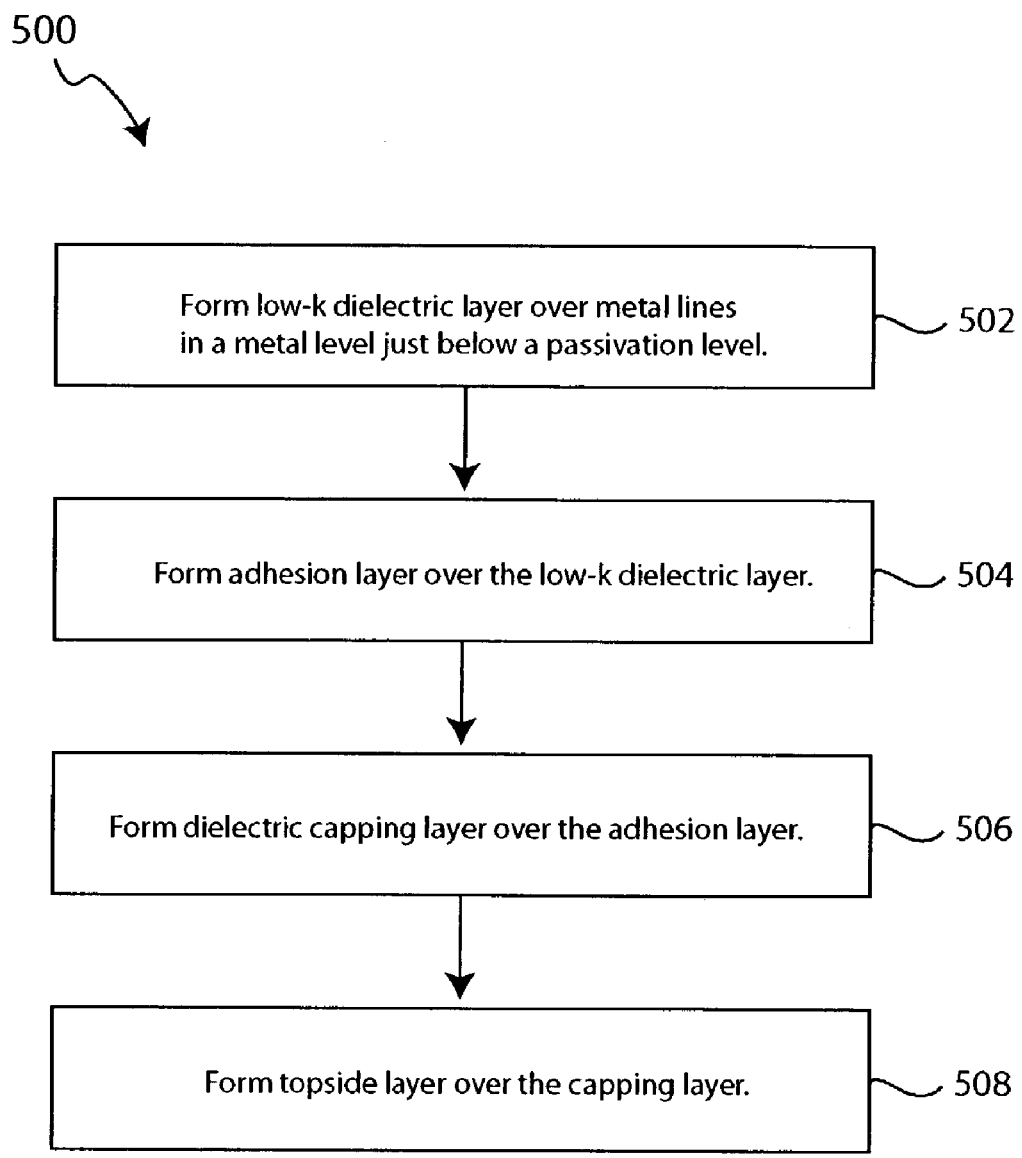
FIG. 5 shows a flow diagram of a method of forming a passivation level in accordance with an embodiment of the present invention.

FIG. 5 shows a flow diagram of a method 500 of forming a passivation level in accordance with an embodiment of the present invention. It is to be noted that although method 500 is explained in the context of forming a passivation level, one of ordinary skill in the art may adapt method 500 to form levels other than a passivation level.

In step 502, a low-k dielectric layer is formed over metal lines in a metal level just below the passivation level. The metal level may be the last metal level if the integrated circuit has several metal levels, or the first metal level if the integrated circuit has only one metal level. Preferably, the low-k dielectric layer has gap-fill capability such that step 502 results in the deposition of metal lines on top of and between the metal lines. In one embodiment, the low-k dielectric layer comprises SILK™ dielectric.

In step 504, an adhesion layer is formed over the low-k dielectric layer. In one embodiment, an adhesion layer comprising AP6000™ adhesion promoter is formed on a low-k dielectric layer comprising SILK™ dielectric.

In step 506, a dielectric capping layer is formed over the adhesion layer. In one embodiment, a TEOS capping layer is formed on the adhesion layer.

In step 508, a topside layer is formed over the capping layer. In one embodiment, the topside layer comprises silicon nitride.

While specific embodiments of the present invention have been provided, it is to be understood that these embodiments are for illustration purposes and not limiting. Many additional embodiments will be apparent to persons of ordinary skill in the art reading this disclosure. Thus, the present invention is limited only by the following claims.

What is claimed is:

1. A method of fabricating an integrated circuit, the method comprising:
    forming a low-k dielectric layer over metal lines, the metal lines being in a metal level just below a passivation level;
    forming an adhesion layer on the low-k dielectric layer;
    forming a dielectric capping layer on the adhesion layer; and
    depositing a topside layer over the dielectric capping layer.

2. The method of claim 1 wherein the low-k dielectric layer comprises a dielectric material having a dielectric constant of about 2.65.

3. The method of claim 1 wherein the adhesion layer comprises an adhesion promoter.

4. The method of claim 1 wherein the adhesion layer is formed to a thickness of about 70 Angstroms.

5. The method of claim 1 wherein the low-k dielectric layer substantially fills spaces between the metal lines.

6. The method of claim 1 wherein the topside layer comprises silicon nitride.

7. A structure in an integrated circuit, the structure comprising:
    a low-k dielectric layer over metal lines, wherein the low-k dielectric layer substantially fills spaces between the metal lines;
    an adhesion layer on the low-k dielectric layer;
    a dielectric capping layer on the adhesion layer; and
    a topside layer on the dielectric capping layer.

8. The structure of claim 7 wherein the low-k dielectric layer has a dielectric constant of about 2.65.

9. The structure of claim 7 wherein the adhesion layer comprises an adhesion promoter.

10. The structure of claim 7 wherein the adhesion layer is about 70 Angstroms thick.

11. A method of forming a passivation level in an integrated circuit, the method comprising:
    forming a low-k dielectric layer over metal lines in a last metal level;
    forming an adhesion layer over the low-k dielectric layer;
    forming a capping layer over the adhesion layer; and
    forming a topside layer over the capping layer.

12. The method of claim 11 wherein the adhesion layer comprises an adhesion promoter.

13. The method of claim 11 wherein the capping layer comprises TEOS (tetraethyl ortho-silicate) and the low-k dielectric layer has a dielectric constant of about 2.65.

14. A method of fabricating an integrated circuit, the method comprising:
    forming a low-k dielectric layer over metal lines;
    forming an adhesion layer on the low-k dielectric layer;
    forming a dielectric capping layer on the adhesion layer;
    depositing a topside layer over the dielectric capping layer;
    wherein the low-k dielectric layer and the adhesion layer are portions of a passivation level.

15. The method of claim 14 wherein the dielectric capping layer comprises silicon dioxide deposited using TEOS (tetraethyl ortho-silicate) as a precursor.

16. The method of claim 14 wherein the low-k dielectric layer substantially fills spaces between the metal lines.

17. The method of claim 14 wherein the dielectric capping layer comprises silicon nitride.

18. A method of fabricating an integrated circuit, the method comprising:
forming a low-k dielectric layer over metal lines;
forming an adhesion layer on the low-k dielectric layer;
forming a dielectric capping layer on the adhesion layer;
depositing a topside layer over the dielectric capping layer;
wherein the dielectric capping layer comprises silicon dioxide deposited using TEOS (tetraethyl ortho-silicate) as a precursor.

19. The method of claim 18 wherein the low-k dielectric layer substantially fills spaces between the metal lines.

20. The method of claim 18 wherein the topside layer comprises silicon nitride.

* * * * *